United States Patent
Hassan et al.

(10) Patent No.: US 11,081,191 B2
(45) Date of Patent: Aug. 3, 2021

(54) DYNAMIC SWITCHING FOR IMPROVED POWER UTILIZATION

(71) Applicant: Western Digital Technologies, Inc., San Jose, CA (US)

(72) Inventors: Yoseph Hassan, Nechusha (IL); Shay Benisty, Beer Sheva (IL)

(73) Assignee: Western Digital Technologies, Inc., San Jose, CA (US)

(*) Notice: Subject to any disclaimer, the term of this patent is extended or adjusted under 35 U.S.C. 154(b) by 160 days.

(21) Appl. No.: 16/444,671

(22) Filed: Jun. 18, 2019

(65) Prior Publication Data

US 2020/0402593 A1 Dec. 24, 2020

(51) Int. Cl.
*G11C 16/32* (2006.01)
*G06F 1/04* (2006.01)
*G06F 3/06* (2006.01)
*G11C 16/30* (2006.01)
*G11C 16/04* (2006.01)

(52) U.S. Cl.
CPC .............. *G11C 16/32* (2013.01); *G06F 1/04* (2013.01); *G06F 3/0604* (2013.01); *G06F 3/0625* (2013.01); *G06F 3/0632* (2013.01); *G06F 3/0659* (2013.01); *G06F 3/0679* (2013.01); *G11C 16/30* (2013.01); *G11C 16/0483* (2013.01)

(58) Field of Classification Search
CPC ..... G11C 16/32; G11C 16/30; G11C 16/0483; G06F 1/04; G06F 3/0604; G06F 3/0632; G06F 3/0679; G06F 3/0625; G06F 3/0659

See application file for complete search history.

(56) References Cited

U.S. PATENT DOCUMENTS

| | | | |
|---|---|---|---|
| 7,516,281 B2 | 4/2009 | LaBerge | |
| 7,554,353 B2 | 6/2009 | Lee et al. | |
| 7,786,752 B2 | 8/2010 | Oh et al. | |
| 7,868,648 B2 | 1/2011 | Lee et al. | |
| 8,035,412 B2 | 10/2011 | Choo et al. | |
| 8,760,922 B2 | 6/2014 | Lassa | |
| 8,928,349 B2 | 1/2015 | Oh et al. | |
| 8,988,952 B2 | 3/2015 | Hiraishi et al. | |
| 9,053,066 B2 | 6/2015 | Ramachandra et al. | |
| 9,311,979 B1 | 4/2016 | Ramachandra et al. | |
| 9,329,804 B2 | 5/2016 | Lassa | |
| 9,524,799 B2 | 12/2016 | Desireddi et al. | |
| 9,646,708 B2 | 5/2017 | Miwa | |
| 9,658,789 B2 | 5/2017 | Erez | |
| 10,013,194 B1 | 7/2018 | Yang et al. | |
| 2004/0228196 A1 | 11/2004 | Kwak et al. | |
| 2004/0240298 A1* | 12/2004 | Jin | G11C 11/4076 365/222 |
| 2009/0153185 A1* | 6/2009 | Oh | H03K 19/017 326/30 |
| 2011/0205832 A1 | 8/2011 | Jeon | |
| 2013/0002291 A1* | 1/2013 | Park | G11C 7/1057 326/30 |

(Continued)

*Primary Examiner* — Mohammed A Bashar
(74) *Attorney, Agent, or Firm* — Vierra Magen Marcus LLP

(57) ABSTRACT

A device, for example a memory system, is disclosed wherein two or more operational modes may be set. The clock toggle rate and ODT resistors are dynamically controlled based on one or more of a desired margin of signal integrity, performance, cooling rate, and power consumption.

20 Claims, 5 Drawing Sheets

(56) References Cited

U.S. PATENT DOCUMENTS

| | | |
|---|---|---|
| 2013/0159601 A1 | 6/2013 | Lassa |
| 2013/0173846 A1 | 7/2013 | Lassa |
| 2014/0185374 A1 | 7/2014 | Ramachandra |
| 2016/0041786 A1 | 2/2016 | Erez |
| 2016/0189758 A1 | 6/2016 | Desireddi et al. |
| 2018/0173444 A1 | 6/2018 | Marcu et al. |
| 2018/0284857 A1 | 10/2018 | Yang et al. |
| 2018/0349046 A1 | 12/2018 | Yang et al. |

\* cited by examiner

DYNAMIC SWITCHING FOR IMPROVED POWER UTILIZATION

BACKGROUND

Solid state drives (SSDs) have advantages over traditional hard disk drives (HDDs) in that solid state drives typically have a higher data throughput, lower read/write latency, and lower power consumption. Herein, "solid state drive" refers to a memory device providing a large memory capacity utilizing non-volatile semi-conductor gates, such as NAND or NOR gate devices, where a memory device refers to any device providing data storage for another device. Examples of memory devices include solid state drives, hard disk drives, optical drives, and devices providing volatile memory storage such as dynamic random access memory (DRAM). Other examples of memory devices include memory cards, and Universal Serial Bus (USB) FLASH drives.

Solid state drives may provide memory capacity on par with hard disk devices but with much higher performance. NAND flash memories in particular tend to have a lower price and a larger capacity relative to other non-volatile memory types (memory that retains its state in the absence of operating power).

NAND flash memories used in solid state drives may experience temperature heating effects, which cause detrimental impacts to the hardware, the system reliability, and the data integrity. Clock throttling may be utilized to mitigate the heating effects by controlling the solid state drives to produce less heat. However conventional clock throttling approaches result in inefficient power consumption.

On-Die-Termination Resistors (ODT resistors) are utilized to reduce mismatch reflections and improve the signal integrity and bandwidth of high-bandwidth transmission lines such as high-speed memory busses. Herein, "ODT resistors" refers to resistors electrically coupled to a transmission line to configure the impedance experienced by signals transmitted on the transmission line. One or more ODT resistors may be configured in parallel on the transmission lines. A "transmission line" is one or more wire(s) carrying data signals in a device and a "resistor" refers to any circuit element providing an impedance. Resistors include pure resistive elements and elements including some design-purpose inductance and capacitance. Resistors may be passive or active devices.

In order for a transmission line to minimize distortion of the signal it carries, the impedance of the transmission line should be uniform throughout its length. If there is any location in the transmission line where the impedance is not uniform for some reason the transmitted signal may be modified by reflection at that location which results in distortion, ringing, and so forth.

When the transmission line comprises an impedance discontinuity, in other words an impedance mismatch, then an equivalent amount of impedance may be disposed at the point of discontinuity. This is what is meant by "termination". For example, resistors are sometimes configured on computer motherboards to terminate high speed busses. There are several manners of termination depending on how the resistors are configured to the transmission line. Parallel termination and series termination are examples of termination methodologies.

The use of ODT resistors improves the impedance characteristics of the transmission line and enables operation at high clock rates. However, use of ODT resistors results in higher power consumption. This extra power consumption is particularly a problem at higher operating temperatures, which can occur for example if the transmission line is heavily loaded.

Dynamic ODT is a technique that provides increased flexibility to optimize termination values for different loading conditions of a transmission line. For example a bus may be terminated with a first impedance value (e.g., 30Ω or 40Ω) when in an idle condition. When the bus is accessed for a high-performance operation, such as a serial WRITE operation in the case of a memory bus, a second, greater termination impedance may be utilized, for example, 60Ω or 120Ω. For example, conventional dynamic ODT enables a Dynamic Data Rate 3.0 (DDR3) memory to switch between a first and second termination impedance based on conditions such as these. Herein, "switch" refers to any device providing controllable changes in impedance between an open state of very high or effectively infinite impedance, and a closed state of very low or effectively zero impedance. Examples of switches are NMOS transistors and PMOS transistors, and mechanical switches. Dynamic ODT may thus improve bus operation especially at higher data rates. The dynamic ODT capability of conventional DDR3 ODT has limited availability and inefficient power consumption.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
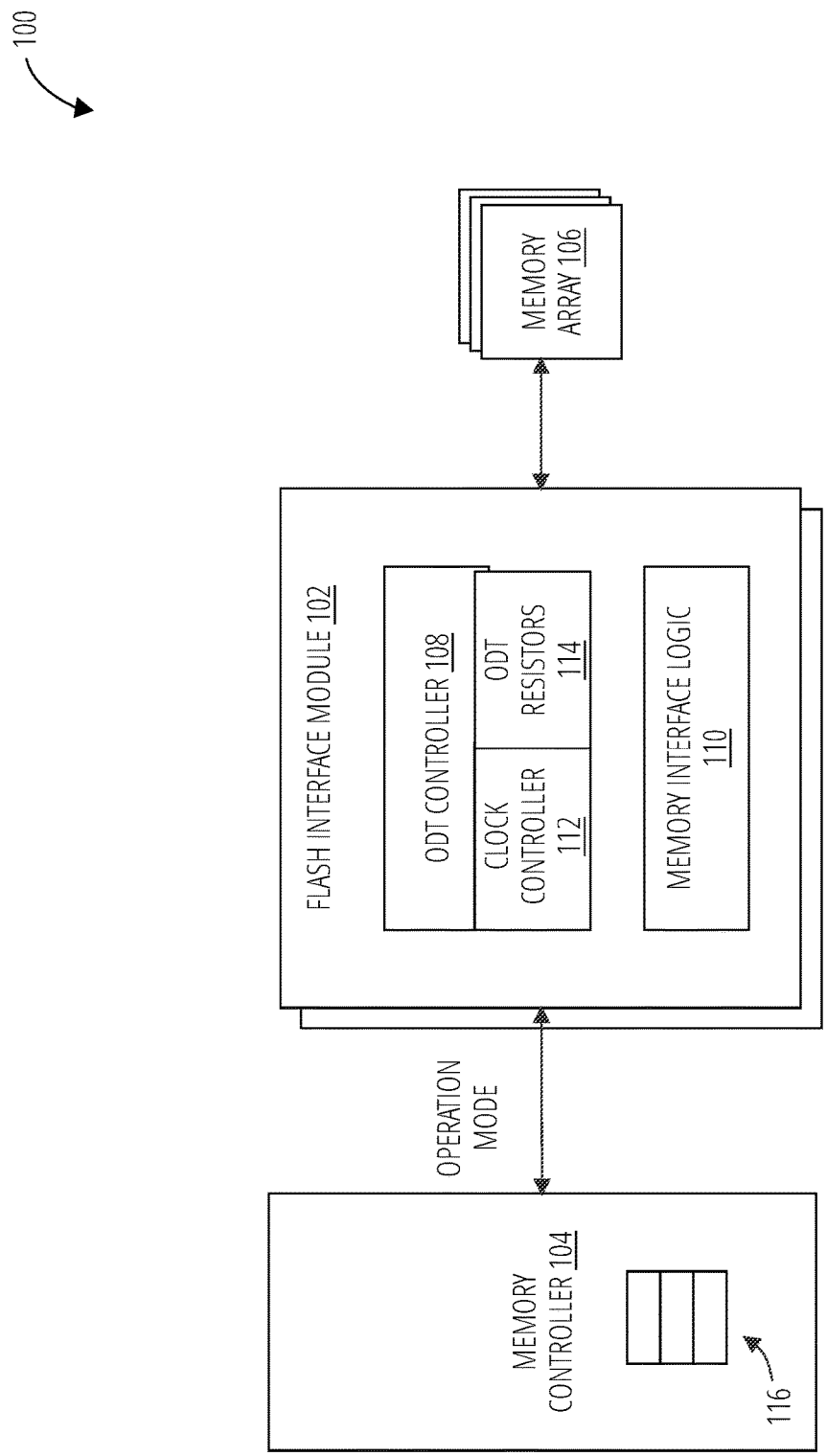
FIG. 1 illustrates a memory system 100 in accordance with one embodiment.

Thermal throttling to control device temperature is conventionally achieved by skipping clock cycles. This in turn may slow down data transmission on a transmission line of the device, which is triggered by either or both of the rising and falling edges of the clock signal.

In the conventional throttling mechanism, the clock toggle rate (and hence the clock frequency) is not changed. Instead, clock cycles are skipped. Current flows continuously through the ODT resistors even during the skipped cycles of the clock signal. Hence the device does not cool down as rapidly or as much as it could. In the new approach disclosed herein, the clock period is widened based on a condition, such as a workload profile, temperature of the memory device, and/or performance requirement. Widening the clock period decreases the clock toggle rate.

A "performance requirement" refers to a timing requirement, for example a completion time or latency limit imposed on a memory command or commands. The performance requirement may take the form of a latency requirement of the command or commands, or a throughput requirement (X commands must complete in Y amount of time), for example. A performance requirement may be inherent in a command based on design specifications, or explicitly configured by a host device providing the command. A "host device" is a device such as a computer system that issues memory commands to a service device, such as a memory device. A "workload" refers to the commands received by device and queued for execution, which may include commands currently undergoing execution. The workload can include not only a number of commands received and queued for execution, or expected to be received (e.g., based on hints provided by the host device), but also the types of commands and/or associated performance requirements of the commands. The "clock period" is the time between an edge (e.g., either rising or falling) of a first clock pulse and the corresponding edge of the next clock pulse in sequence. The clock toggle rate is the time between the rising and falling edges of one clock pulse.

Non-exhaustive examples of conditions that may effect changes to the clock toggle rate and hence ODT settings include: (1) host hints that may accompany a command to the device, e.g., command priority or a type of the command, (2) an expected or required quality of service for a command, and (3) host parameters or settings such as Peripheral Component Interconnect Express (PCIe) packet configuration settings and host device command latency requirements.

The examples described herein are described in terms of memory commands, but the invention is not limited to memory devices. A memory command is a command issued to a memory controller, for example a READ command, a WRITE command, or an ERASE command. Generally, a controller is any logic to control the operation of other logic. When a controller is implemented in hardware, it may for example be one of many well-known models of microprocessor, or a custom controller implemented using an application-specific integrated circuit (ASIC), a system-on-a-chip (SOC), or in many other manners known in the art. A controller may also be implemented in software or firmware, as computer instructions stored in a volatile memory or a non-volatile memory. Controllers are typically used to coordinate the operation of multiple other components in a system, for example providing signals to the other components to start and stop their operation, or to instruct the other components with particular commands to carry out.

Examples of host hints that may accompany a command include a total number of commands the device can expect to imminently receive from the host device, the type of those commands, and an amount of data to read or write based on those imminent commands. As noted prior, memory command types include READ, WRITE, and ERASE, but may also include FORMAT and other command types known in the art, including commands that may be unique to the model or type of the memory device.

The ODT resistors may be controlled in conjunction with widening of the clock pulse and hence slowing the clock toggle rate, to consume less power, or in conjunction with narrowing the clock pulse and thus increasing the clock toggle rate, to consume more power with the benefit of higher performance. In some embodiments, this may involve switching between a high toggle rate in the range of 800 MB/s to 1200 MB/s, and a low toggle rate of around 200 MB/s. As noted prior, "toggle rate" refers to the time between the rising and falling edges of a clock pulse, and hence for periodic clock pulses defines the frequency at which the clock signal can trigger other circuits.

The dynamically configurable clock toggle rate may be implemented in a number of ways depending on design considerations, for example using a T-flop, data length extension (DLE) circuit, voltage controlled oscillator (VCO), delay-locked-loop (DLL), or a phase-locked-loop (PLL). A phase-locked-loop is logic that generates an output signal whose phase is related to the phase of an input signal. One example of a phase-locked-loop is an electronic circuit comprising a variable frequency oscillator and a phase detector in a feedback loop. The oscillator generates a periodic signal, and the phase detector compares the phase of that signal with the phase of the input periodic signal, adjusting the oscillator to keep the phases matched. A delay-locked-loop is logic to introduce a delay into a periodic signal by passing the signal through a feedback path that includes a latency-introducing element, such as one or more inverters.

High workloads requiring high performance may be indicated, for example, when queued commands or host hints indicate writing or reading a body of sequential data (e.g., one or more serial WRITE or READ command). Such commands require a memory device to sustain a higher level of performance than do random-access reads or writes.

Increasing the clock pulse width while maintaining, for example, a 50% duty cycle effectively reduces the clock toggle rate and enables the data signal to take a longer time to change levels which uses less energy and also enables higher fidelity of the data at the data signal receiver. The conventional approach of skipping clock cycles (throttling the clock) slows down execution of the overall workload because there are fewer rising and falling edges of the clock signal to clock data onto the transmission line in a given time period. However the data that is clocked onto the transmission line must still switch levels just as quickly as before the clock signal was throttled, in order to be accurately captured by the receiver at the rising and falling edge of each clock pulse. This requires more energy and necessitates faster and more accurate data slicing at the receiver.

The disclosed approach decreases the clock toggle rate by widening the clock pulse width in response to a device condition. However because the rising and falling edges of the clock pulse are spread apart in time, the data clocked onto the data line may transition more slowly between levels, which takes less energy and which provides the receiver with a longer interval during which to slice the data (higher fidelity). In conjunction with increasing or decreasing the clock toggle rate, the ODT resistors are dynamically controlled (e.g., activated or deactivated). A target balance may thus be achieved in the device between performance and power consumption. This target balance may be configured in the device for carrying out particular commands, for example. The target balance may in some cases be configured by a host device, for example as settings made in registers of a memory controller.

FIG. 1 depicts a memory system 100 of a storage device, such as a solid state drive. A FLASH interface module 102 may operate independently on the channels of the memory array 106, and there may be multiple FLASH interface modules in the memory system 100, one for each memory channel. "Memory channel" refers to a communication path for data to and from a memory. Memory channels are typically operable in parallel with one another, increasing throughput of data to and from the memory. For example in a multi-die memory package comprising four NAND memory dies, in which each NAND die comprises two memory channels, there may be eight FLASH interface modules. The FLASH interface module 102 may carry out aspects of the techniques disclosed herein, for example the dynamic ODT control process 400 described in conjunction with FIG. 4. The FLASH interface module 102 may also carry out other operations on the memory channel typically associated with flash translation layer logic. "Flash translation layer" refers to a logic component in a memory device involved in the writing of data, typically involved in operations such as logical address translation, memory page management, memory wear leveling, and memory garbage collection. Modern flash translation layers may be configured to perform these operations while minimizing write amplification, which is the ratio of the amount of data actually written when executing a write command, to the amount of data in the write command as issued to the memory device. In some implementations, some or all of the flash translation layer logic may be implemented on the host device.

Figure 5:
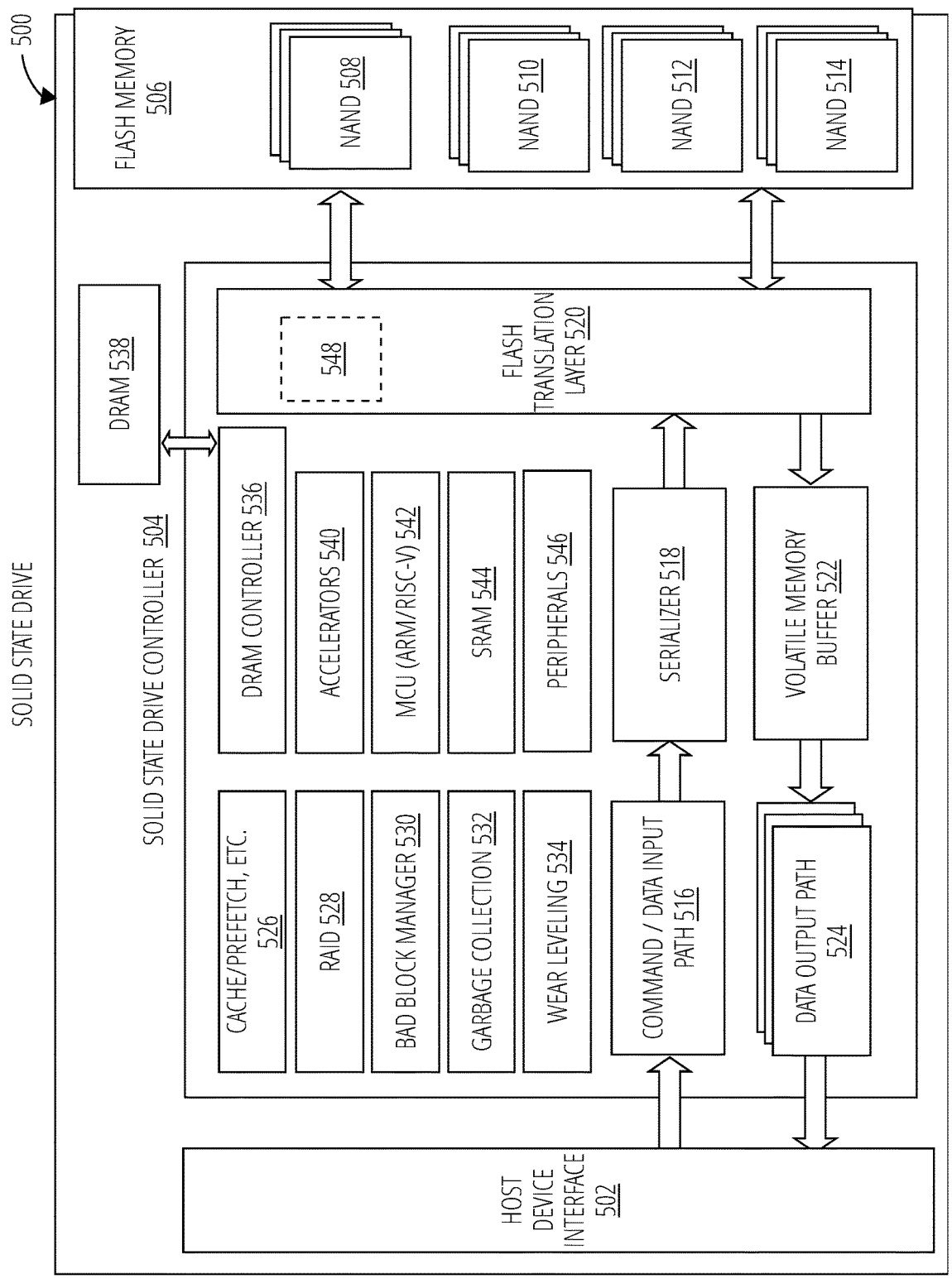
FIG. 5 illustrates a solid state drive 500 in accordance with one embodiment.

The memory controller 104 may be a micro-controller unit 542 such as the one depicted in FIG. 5. The memory controller 104 may control the operating modes described above for each FLASH interface module 102, based on conditions or states of the memory system. "Memory system" refers to a memory device including a controller operable on at least one memory array. Memory systems typically include many other components as well, as known in the art. "Memory array" refers to a collection of memory cells, organized into an array of rows and columns. Memory arrays may be two or three dimensional. These conditions may depend on the current workload of the memory system, or on other conditions. For example the workload or expected workload may comprise primarily random-access commands, and hence a lower toggle rate in conjunction with disabling of some or all of the ODT resistors may be undertaken. "Random-access commands" refers to Memory commands targeting non-sequential addresses in a memory. Random-access commands are distinguished from serial or block commands, which target multiple contiguous addresses in memory. Commands queued to write a large amount of sequential data may be detected as an increase in the workload, and an increased need for performance, requiring a higher toggle rate of operation. Techniques for profiling memory system workloads are known and will not be described in detail herein.

In some implementations, the memory controller 104 may be configured, for example by a host device, to seek a target balance between power consumption and performance requirements. This balance may be configured for example by settings made in registers 116. The memory controller 104 may comprise the registers 116 for these setting or the registers 116 may be separate from the memory controller 104. The settings may be associated with particular commands or may apply more generally to operation of the memory system 100.

Each FLASH interface module 102 may implement an ODT controller 108 that controls the selected ODT resistors 114 and may switch between operating modes dynamically. Control of the clock toggle rate on a particular transmission lines may be accomplished for example by dividing a generated clock signal using the clock controller 112 before propagating the divided clock signal to the memory interface logic 110.

Figure 2:
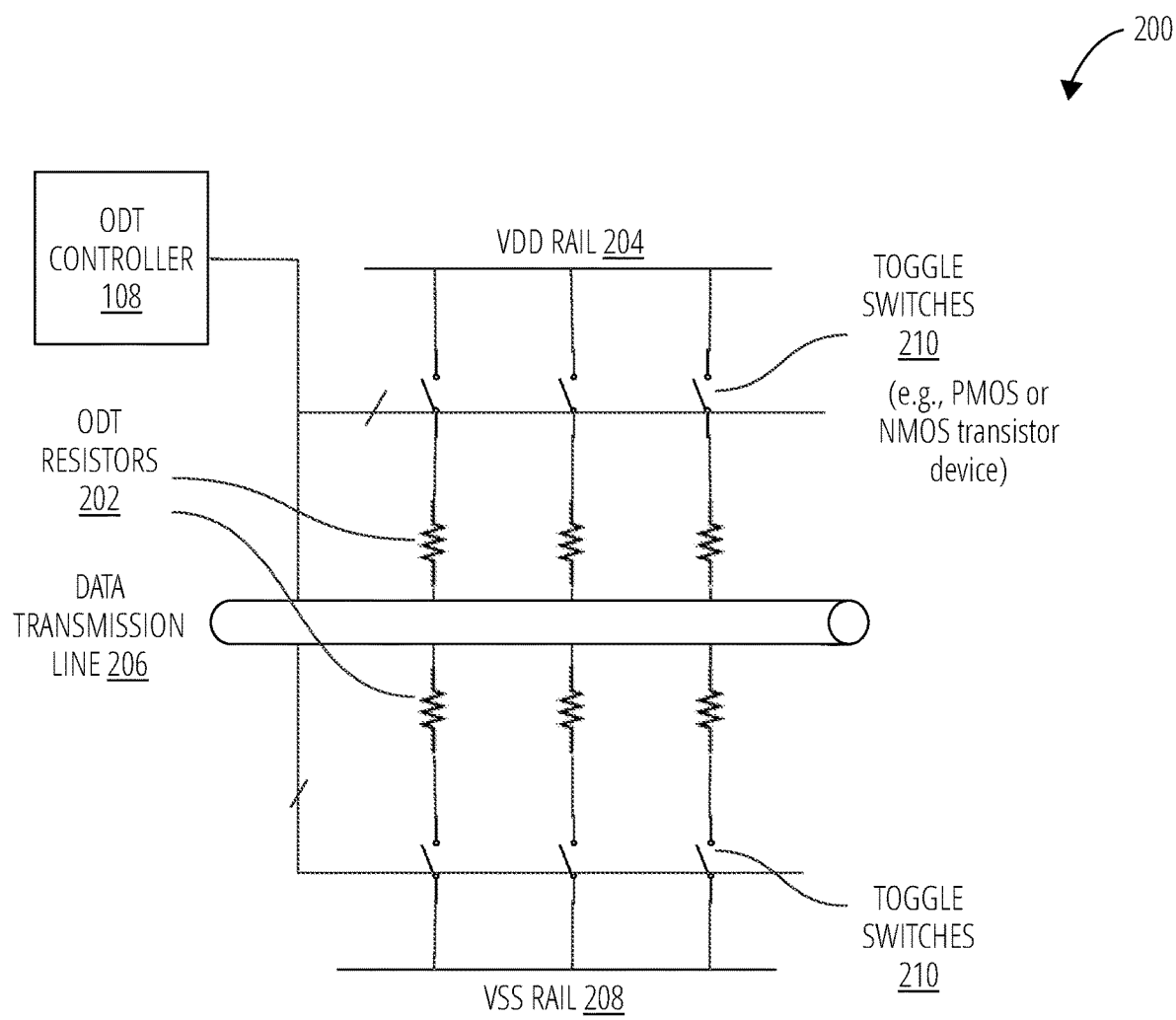
FIG. 2 illustrates configurable ODT resistors 200 in accordance with one embodiment.

FIG. 2 illustrates an exemplary arrangement of configurable ODT resistors 200 that may be used to reduce transmission line reflections and improve the signal integrity and bandwidth of the transmission line. ODT resistors 202 may be configured along the transmission line 206 in parallel with the power rail 204 and the power reference rail 208. In one embodiment the transmission line 206 is one or more wires of a memory bus communicating data to and from a memory array.

Conventionally, the ODT resistor configuration is not dynamically configurable in conjunction with altering the clock toggle rate and further based, for example, on a workload or temperature of the device. In the present disclosure, configurable toggle switches 210 may be operated to couple and decouple the ODT resistors 202 from the transmission line 206 dynamically and individually, to tune transmission line 206 impedance as required when operating in a high performance mode, as well as to deactivate one or more of the ODT resistors 202 when operating in a lower power consumption mode. Herein "activation" and "deactivation" of ODT resistors refers to electrically coupling or decoupling the ODT resistors from the transmission line, using controllable switches. The ODT resistors and/or the switches may thus be referred to as being "configurable". Activation or deactivation of the ODT resistors is performed in conjunction with altering the clock toggle rate based on certain operating conditions of the device.

The configurable toggle switches 210 may be operating by the ODT controller 108 to tune the impedance of the transmission line 206 to work best with the current data rate or a target performance and power consumption target. For example, assume an array of three 25Ω resistors connected in parallel between a memory bus transmission line and the power reference rail 208 (e.g., signal ground). Impedance matching may be optimized by switching in a resistance of between 10Ω and 15Ω on the transmission line. This may be achieved by toggling the configurable toggle switches 210 to connect two of the ODT resistors 202 to the power reference rail 208, for an effective added resistance of 12.5Ω. This added resistance may dampen high frequency noise artifacts out of the signal on the transmission line 206, leading to a higher fidelity data transmission.

The ODT resistors 202 improve the termination alignment of the transmission line and enable transmission higher data rates than would otherwise be possible. However in conventional systems the ODT resistor power consumption remains high even when the clock is throttled. This extra power consumption may be problematic for example when the device temperature escalates under high load conditions.

In this scenario the device may attempt to cool itself. Power consumption may be reduced and cooling accelerated by configuring the ODT resistors 202 in conjunction with adjusting the clock toggle rate. Some or all of the configurable toggle switches 210 may be opened or closed in coordination with altering the clock toggle rate. For example dynamically closing some or all of the configurable toggle switches 210 as the clock toggle rate is increased may maintain a high signal fidelity. This may be done as the device temperature decreases after an overheated condition. Similarly, dynamically opening some of all of the configurable toggle switches 210 as the clock toggle rate is decreased may help cool the device while taking advantage of the lower clock toggle rate to for higher signal fidelity.

Figure 3:
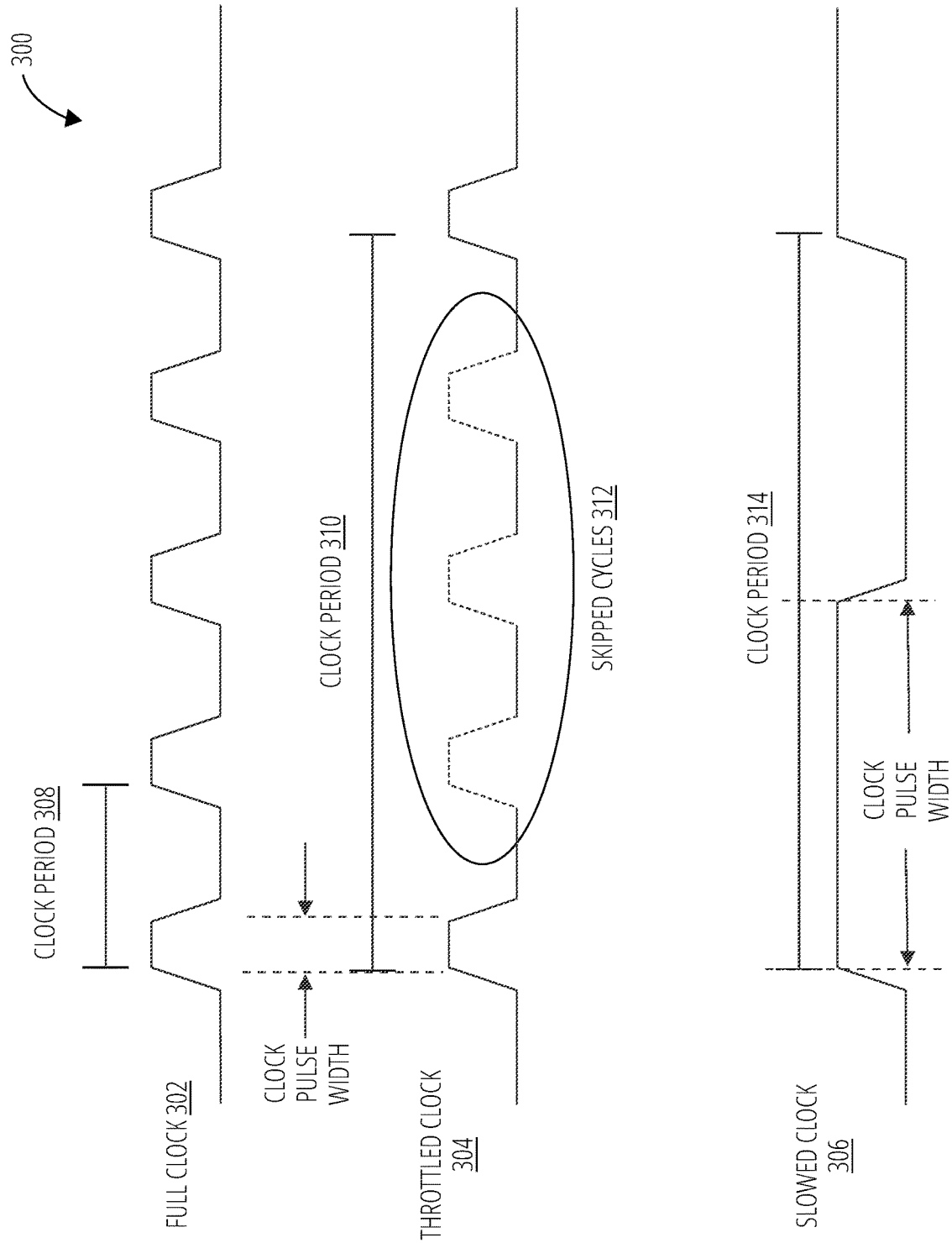
FIG. 3 illustrates a clock signals 300 in accordance with one embodiment.

FIG. 3 illustrates clock signals 300 in various scenarios. Exemplary signals are depicted for a full-rate clock signal 302, a throttled clock signal 304, and a slowed clock toggle rate 306.

The conventional thermal throttling approach applies a throttled clock signal 304 to cool off a device. In effect, the full-rate clock period 308 is increased to the throttled clock period 310. However the clock toggle rate remains unchanged. The skipped clock cycles 312 may eventually result in the desired thermal throttling, the clock cycles that are not skipped maintain the same throttle rate as the full-rate clock signal 302. In other words, duty cycles other than 50% are introduced by the throttled clock period 310 while using the same clock pulse width as the full-rate clock signal 302.

Utilizing the throttled clock signal 304 causes current to flow continuously through the ODT resistors, even during the skipped clock signals. This is because the ODT resistors couple the transmission line to the power rail of the device. As a result of this continuous current flow the device may not cool down as efficiently as in the new approach.

Utilizing a slowed clock toggle rate 306 with an extended clock period 314 reduces power consumption and widens (and broadens, typically) the signaling eye at the receiver end of the transmission line. The toggle rate of the clock signal is substantially reduced unlike in the conventional approach. This enables a wider margin for both generating and detecting the data signal on the transmission line. In conjunction with lowering the clock toggle rate, the ODT resistors are dynamically deactivated partially, or all together. The memory controller may select from between two or more toggle rate operating points. One operating point may utilize a high clock toggle rate, providing maximum performance at highest power consumption, with the ODT resistors all activated (electrically coupled to the transmission line); a lowest power consumption operating point may lower the clock toggle rate the most, and deactivate all the ODT resistors; and intermediate operating points may set the clock toggle rate between these extremes and activate/deactivate some but not all of the ODT resistors. Signal fidelity at the receiver may likewise adapt along with the clock toggle rate and the settings of the ODT resistors.

Note that the duty cycle of the clock signal need not be maintained at 50% in all implementations. The longer the clock pulses are maintained in a high state (closer to the voltage level on the power rail), the less current that may flow through the ODT resistors between the transmission line and the power rail. Data may be clocked on and off the transmission line on the rising and/or falling edges of the clock pulses. Transmitters and receivers may be designed to account for clock signals that do not utilize 50% duty cycles in some implementations.

Figure 4:
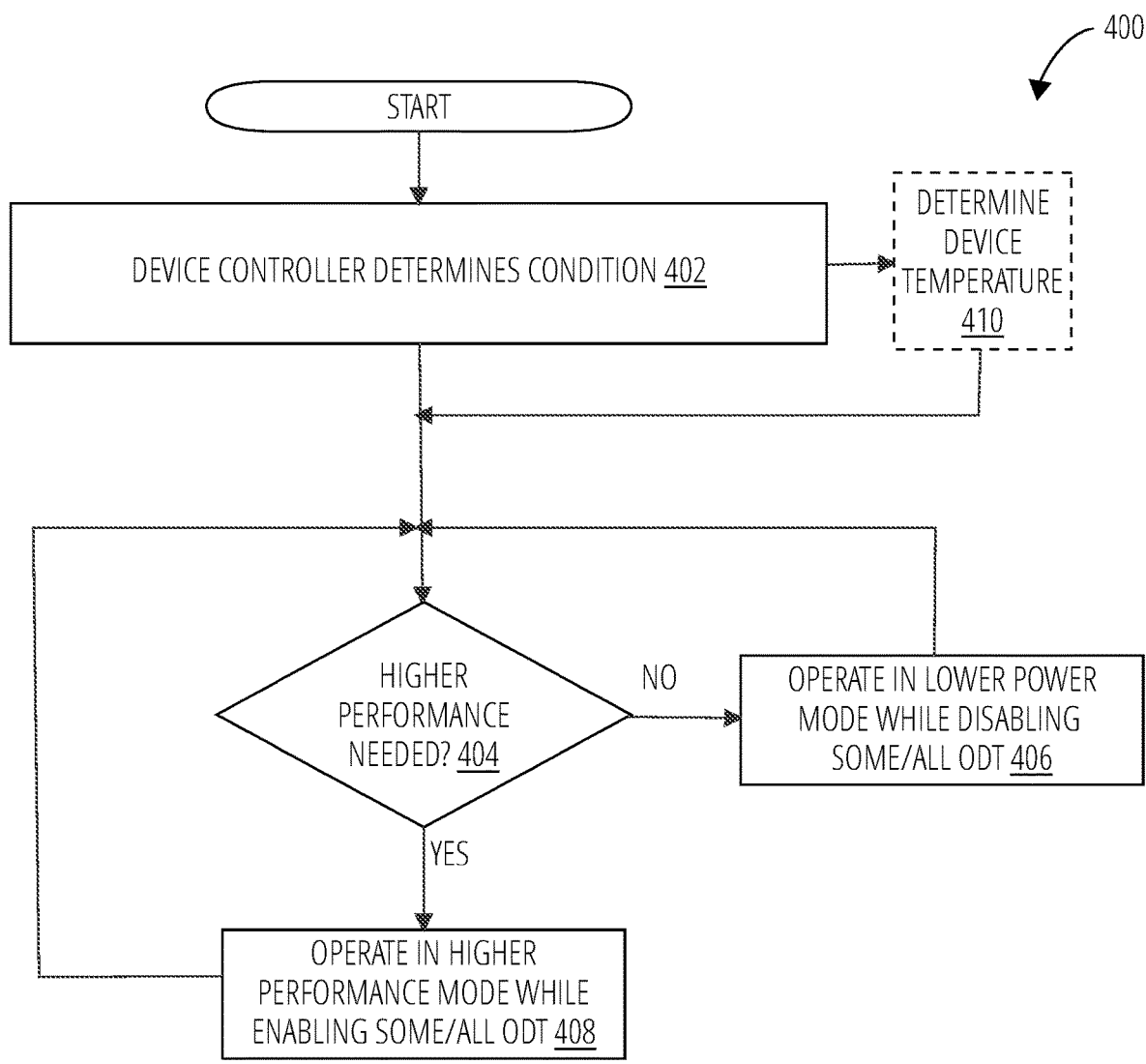
FIG. 4 illustrates a dynamic ODT control process 400 in accordance with one embodiment.

FIG. 4 depicts a dynamic ODT control process 400 in one embodiment. A device controller may determine a workload or other condition, e.g., based on a command queue for accessing a memory array, such as a NAND flash memory array (step 402). The device temperature may also be taken into account, or may be the determining factor (step 410). Next the controller chooses an operating point for the device. The operating point may be performance optimized, working at a high clock toggle rate and enabling some or all ODT resistors. This "performance mode" may emphasize performance. Performance mode may incur higher power consumption and some or all of the ODT switches may be activated (closed) to maintain sufficient signal integrity for the high toggle rate (step 408). The controller may alternatively select an operating point that is power optimized, working at a lower clock toggle rate and disabling the ODT resistors. Some or all of the ODT switches may be deactivated (opened) in this mode because the toggle rate is low enough to provide a valid data sampling window even when some reflections are present on the transmission line (step 406). The choice of operating mode is depicted at decision step 404.

FIG. 5 illustrates a solid state drive 500 in one embodiment. The solid state drive 500 is an example of an embodiment in which a micro-controller unit 542 implements control function carried out by the memory controller 104 of FIG. 1. A channel 1 FLASH interface module 548 and channel 2 FLASH interface module 550 carry out the tasks performed by the FLASH interface module 102 of FIG. 1, for example the techniques disclosed in conjunction with FIG. 1-FIG. 4. The memory array 106 of FIG. 1 may be considered to represent any of the NAND arrays in FLASH memory 506 (i.e., NAND gate group 508, NAND gate group 510, NAND gate group 512, and NAND gate group 514).

The controller 504 may have a one ASIC or two-chip architecture (front end chip and backend chip) with proper function partitioning. The FLASH memory 506 may receive processed data from the flash translation layer 520 and return a data output. The FLASH memory 506 may include logic to determine which of the NAND gate groups to utilize to generate the data outputs, which are sent to the flash translation layer 520. The solid state drive 500 may receive a command (or control signal) at the host device interface 502, which is then received at the command/data input path 516.

The host device interface 502 prioritizes which of the physical layers to utilize during a data or command transfer to the host device. The host device interface 502 may be configured by the data output path 524 regarding delays in sending and reporting sent and received data and commands. The host device interface 502 further sends incoming data for NAND processing to the command/data input path 516.

The command/data input path 516 receives data for NAND processing from the host device interface 502. The data is then sent to a serializer 518. The command/data input path 516 further sends control signals regarding workload to a latency estimate logic. The workload attributes may include percentage read, a queue depth, a percentage random, a transfer length, an initiator count, a port count, and input/outputs per second (IOPS). These workload features may be utilized by the controller 504 to determine the operating point (clock period) and settings for the configurable toggle switches 210.

The serializer 518 receives the data from the command/data input path 516. The serializer 518 performs the process of translating data structures or object state into a format that can be stored (for example, in a file or memory buffer) or transmitted (for example, across a network connection link) and reconstructed later (possibly in a different computer environment). Such a control signal may influence the flash translation layer queue depth. The processed data is then sent to the flash translation layer 520. In some embodiments, the processed data alters the flash translation layer queue depth of the flash translation layer 520, altering the number of commands the flash translation layer 520 is concurrently processing.

The flash translation layer 520 receives the processed data as well as the control signal to determine the flash translation layer queue depth, which is indicative of workload. The flash translation layer 520 may interact via control signals to determine the address to send data and commands to the FLASH memory 506 and the volatile memory buffer 522. The flash translation layer 520 may then send data and commands to the FLASH memory 506 and the volatile memory buffer 522. The flash translation layer 520 also receives the data outputs from the FLASH memory 506.

An indirection table stores address locations for various components of the solid state drive 500 to be utilized by the flash translation layer 520.

The volatile memory buffer 522 may send and receive data (processed data, data outputs, etc.) from the flash translation layer 520 and the data output path 524. The volatile memory buffer 522 is a region of a physical memory storage used to temporarily store data while it is being moved from one place to another. For example, the volatile memory buffer 522 may store processed data that is not actively queued in the flash translation layer 520 and send further processed data upon request by the flash translation layer 520. The flash translation layer 520 may perform a similar process for data outputs for the data output path 524.

The data output path 524 determines the scheduling of host device data transfers (e.g., of data outputs) and the scheduling of host device responses. The data output path 524 communicates with the host device interface 502 to send and receive this data and commands. The data output path 524 may be altered by the control signals to delay the data transfers or the response frames. The data output path 524 may send control signals regarding workload to a latency estimate logic. The workload attributes may include percentage read, a queue depth, a percentage random, a transfer length, an initiator count, a port count, and input/outputs per second (IOPS).

The cache/prefetch, etc. 526, the RAID 528, the bad block manager 530, the garbage collection 532, and the wear leveling 534 are firmware stored in the controller 504. This firmware may perform various operations on the solid state drive 500. The DRAM controller 536, the accelerators 540, the micro-controller unit 542, the SRAM 544, and the peripherals 546 may be part of an application-specific integrated circuit (ASIC) on the controller 504 designed for a special application, such as a particular kind of transmission protocol or a hand-held computer. The DRAM controller 536 may interface with the DRAM 538.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. An apparatus comprising:
   a controller configured to:
      increase or decrease a clock toggle rate of a clock signal on a transmission line from a first clock toggle rate to a second clock toggle rate that is different to the first clock toggle rate in response to one or more conditions that include one or more of a workload profile, a temperature, a latency requirement associated with a command, and a throughput requirement associated with a command; and
      cause the activation or deactivation of one or more on-die-termination resistors (ODT resistors) on the transmission line according to the second clock toggle rate.

2. The apparatus of claim 1, wherein the controller is further configured to decrease the clock toggle rate and deactivate one or more of the ODT resistors to achieve a target performance and power consumption.

3. The apparatus of claim 1, the controller further configured to:
   independently control the clock toggle rate and the activation or deactivation of ODT resistors on each of a plurality of transmission lines.

4. The apparatus of claim 1, wherein activation or deactivation of the ODT resistors comprises operating one or more switches.

5. The apparatus of claim 4, wherein operating the one or more switches comprises opening the one or more switches in coordination with decreasing the clock toggle rate.

6. The memory system of claim 1, further comprising one of a delay-locked-loop, a phase-locked-loop, and a T-flop for altering the clock toggle rate.

7. The apparatus of claim 1, wherein the one or more conditions includes a workload of the apparatus.

8. The apparatus of claim 7, the controller further configured to:
    decrease the clock toggle rate based on the workload comprising primarily random-access commands.

9. The apparatus of claim 1, wherein the one or more conditions further include a performance requirement for a command.

10. The apparatus of claim 1, wherein the one or more conditions further include a temperature of the apparatus.

11. A method comprising:
    receiving a command;
    identifying a condition based on one or more of a latency requirement associated with the command and a throughput requirement associated with the command; and
    in response to the condition, changing a clock toggle rate applied to a transmission line used by the device from a first clock toggle rate to a second clock toggle rate that is higher than the first toggle rate in conjunction with activating one or more on-die-termination resistors (ODT resistors) connected to the transmission line to increase a number of connected ODT resistors from a first number associated with the first clock toggle rate to a second number associated with the second clock toggle rate.

12. The method of claim 11, wherein the transmission line is a memory bus.

13. The method of claim 11, further comprising:
    determining a temperature; and
    in response to the temperature, changing the clock toggle rate applied to the transmission line used by the device from the second toggle rate to the first toggle rate in conjunction with deactivating one or more ODT resistors connected to the transmission line to decrease the number of connected ODT resistors from the second number to the first number.

14. The method of claim 11, further comprising increasing the clock toggle rate and increasing a number of connected ODT resistors based on the workload comprising a serial data command.

15. The method of claim 11, further comprising reducing the number of connected ODT resistors based on the workload comprising random-access commands.

16. The method of claim 11, wherein the condition is provided to the device as a hint from a host device.

17. The method of claim 16, wherein the hint includes one or more of the latency requirement and the throughput requirement.

18. The method of claim 16, wherein the hint is an amount of data the host device will provide to the device and a performance requirement for the device to process the amount of data.

19. A memory device comprising:
    a controller;
    a flash translation layer;
    a transmission line coupled to the flash translation layer;
    wherein the controller is configured to:
        identify one or more conditions that include one or more of a workload profile, a temperature, a latency requirement associated with a command, and a throughput requirement associated with a command;
        respond to the one or more conditions to cause an increase or decrease in a clock toggle rate applied to the transmission line; and
        in conjunction with the increase or decrease in the clock toggle rate, increase or decrease an impedance on the transmission line according to the increase or decrease in the clock toggle rate.

20. The system of claim 19, wherein the controller is further configured to increase or decrease the impedance by activating or deactivating switches coupling ODT resistors to the transmission line.

* * * * *